(12) United States Patent
Hentz (10) Patent No.: US 9,325,291 B2
(45) Date of Patent: Apr. 26, 2016

(54) RESONANT DEVICE WITH PIEZORESISTIVE DETECTION AND WITH A RESONATOR CONNECTED ELASTICALLY TO THE SUPPORT OF THE DEVICE, AND METHOD FOR MANUFACTURING THE DEVICE

(75) Inventor: Sebastien Hentz, Varces Allieres et Risset (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 481 days.

(21) Appl. No.: 13/820,756

(22) PCT Filed: Sep. 13, 2011

(86) PCT No.: PCT/EP2011/065809
§ 371 (c)(1),
(2), (4) Date: Mar. 5, 2013

(87) PCT Pub. No.: WO2012/034990
PCT Pub. Date: Mar. 22, 2012

(65) Prior Publication Data
US 2013/0160550 A1 Jun. 27, 2013

(30) Foreign Application Priority Data
Sep. 13, 2010 (FR) .................... 10 57251

(51) Int. Cl.
*H03H 9/09* (2006.01)
*H03H 9/02* (2006.01)
(Continued)

(52) U.S. Cl.
CPC ........... *H03H 9/02259* (2013.01); *G01H 17/00* (2013.01); *H03H 9/2405* (2013.01); *H03H 9/2447* (2013.01); *H03H 2009/0244* (2013.01); *H03H 2009/02496* (2013.01)

(58) Field of Classification Search
CPC ............ H03H 9/02259; H03H 9/2447; H03H 9/2405; H03H 2009/02496; H03H 2009/0244; G01H 17/00
USPC ............................................ 73/579, 650, 651
See application file for complete search history.

(56) References Cited

U.S. PATENT DOCUMENTS

2002/0011117 A1    1/2002   Orsier et al.
2008/0314148 A1    12/2008   Robert
(Continued)

FOREIGN PATENT DOCUMENTS

WO    WO 2009/066203 A1    5/2009
WO    WO 2010/015963 A1    2/2010

OTHER PUBLICATIONS

U.S. Appl. No. 13/818,771, filed Feb. 25, 2013, Hentz.
(Continued)

*Primary Examiner* — John Fitzgerald
*Assistant Examiner* — Rose M Miller
(74) *Attorney, Agent, or Firm* — Oblon, McClelland, Maier & Neustadt, L.L.P.

(57) ABSTRACT

A resonant device with piezoresistive detection and with a resonator connected elastically to the support of the device, and method for manufacturing the device. The device includes: a support; a suspended resonator, which moves parallel to the plane of the support; an actuator for actuating the resonator; and a detector for detecting the movement, including at least one piezoresistive gauge. According to the invention, the resonator is anchored to the support through at least one flexurally elastic element, to enable the threshold where a non-linear displacement regime appears to be raised. The device can be manufactured by a surface technology, and applies notably to resonant mass sensors.

12 Claims, 8 Drawing Sheets

(51) Int. Cl.
*H03H 9/24* (2006.01)
*G01H 17/00* (2006.01)

(56) References Cited

U.S. PATENT DOCUMENTS

| | | |
|---|---|---|
| 2009/0153267 A1 | 6/2009 | Lutz et al. |
| 2010/0186506 A1 | 7/2010 | Robert |
| 2010/0277262 A1 | 11/2010 | Phan Le et al. |
| 2011/0018655 A1 | 1/2011 | Lutz et al. |
| 2011/0187347 A1 | 8/2011 | Goossens et al. |
| 2011/0221301 A1 | 9/2011 | Hentz et al. |

OTHER PUBLICATIONS

U.S. Appl. No. 13/821,701, filed Mar. 8, 2013, Hentz et al.
International Search Report Issued Oct. 7, 2011 in PCT/EP2011/065809.
Preliminary French Search Report Issued May 11, 2011 in Patent Application No. 1057251 (with English translation of Categories of Cited Documents).
E. Mile et al., "In-plane nenoelectromechanical resonators based on silicon nanowire piezoresistive detection", Nanotechnology, XP020174814, vol. 21, 2010, 7 pages.
Ville Kaajakari et al., "Phase Noise in Capacitively Coupled Micromechanical Oscillators", IEEE Transactions on Ultrasonics, Ferroelectrics, and Frequency Control, XP020174814, vol. 52, No. 12, Dec. 2005, pp. 2322-2331.

RESONANT DEVICE WITH PIEZORESISTIVE DETECTION AND WITH A RESONATOR CONNECTED ELASTICALLY TO THE SUPPORT OF THE DEVICE, AND METHOD FOR MANUFACTURING THE DEVICE

TECHNICAL FIELD

The present invention relates to a resonant device, with piezoresistive detection, together with a method for manufacturing the device.

The invention finds applications notably in the field of oscillators for time bases and in the field of MEMS-type (Micro-Electro-Mechanical Systems) or NEMS-type (Nano-Electro-Mechanical Systems) sensors.

It applies, for example, to resonant sensors, and in particular to mass sensors.

STATE OF THE PRIOR ART

For all these applications, performance (for example, mass resolution) depends on the stability of the frequency of the resonator contained in the device, and is proportional to the signal-to-noise ratio, which is noted SNR.

Considering the displacement of the resonator, SNR can be expressed as the ratio $P_0/S_x$. In this ratio, $S_x$ is the spectral noise density and $P_0$ the power of the carrier wave, which is equal to half the square of the resonator's vibration amplitude A.

To improve the resonator's performance, it is therefore sought (1) to obtained a greatest possible vibration amplitude, and (2) to reduce the device's output noise.

(1) Let us consider firstly how a large vibration amplitude may be obtained.

A person skilled in the art always limits this amplitude to a value below an amplitude known as the "critical" amplitude, noted $A_c$, above which the vibration regime becomes non-linear.

Figure 1:
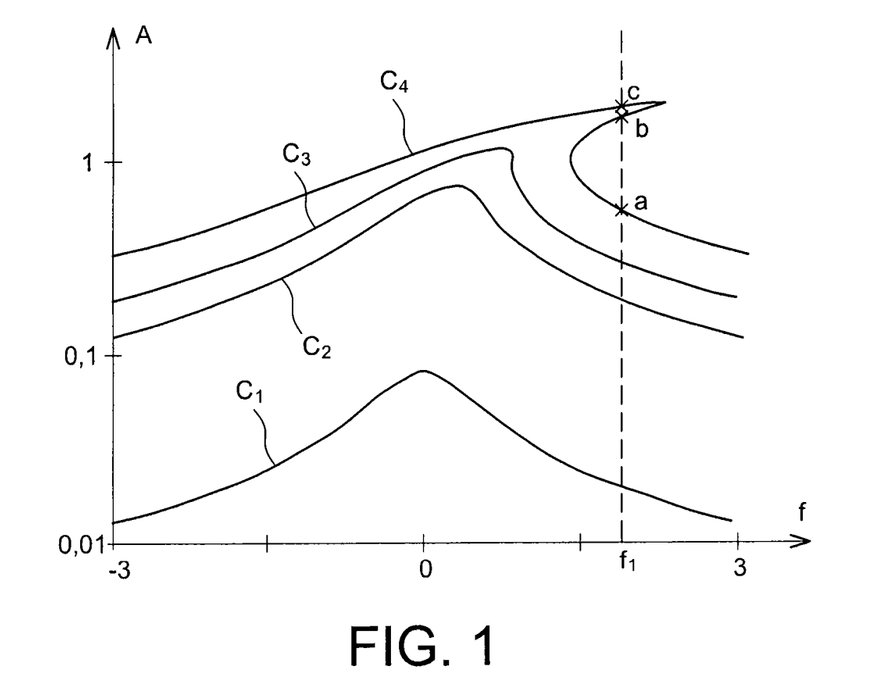
FIG. 1 shows curves representative of the change of amplitude as a function of frequency, for the resonator of a known resonant device, and has previously been described.

The appearance of this non-linear regime is illustrated by FIG. 1. In this figure, a few curves $C_1, C_2, C_3$ and $C_4$ have been plotted which are representative of the changes to amplitude A (in arbitrary units), as a function of frequency f or of the difference of the latter relative to the resonant frequency.

It can be seen that curves $C_1$ and $C_2$ show a linear regime. On the contrary, when the amplitude increases, non-linear phenomena appear, which is the case for curves $C_3$ and $C_4$.

This non-linearity is reflected by several possible amplitudes for certain frequencies, such as frequency f1. For example, the parallel to the ordinate axis, which passes through frequency f1, intersects curve $C_4$ at several points a, b and c.

In other words, in this non-linear regime, the resonator is no longer stable. In one particular area of this regime, there are three possible amplitudes for a given frequency $f_1$. The resonator can therefore "jump" suddenly from one amplitude to another when it is operated in an open loop at a certain frequency.

The amplitude adopted by the resonator also depends on the initial conditions and the external disturbance. The resonator then becomes difficult to control.

Consequently, when the range of frequencies is traversed either upwards or downwards sudden jumps of amplitude can be observed.

Figure 2:
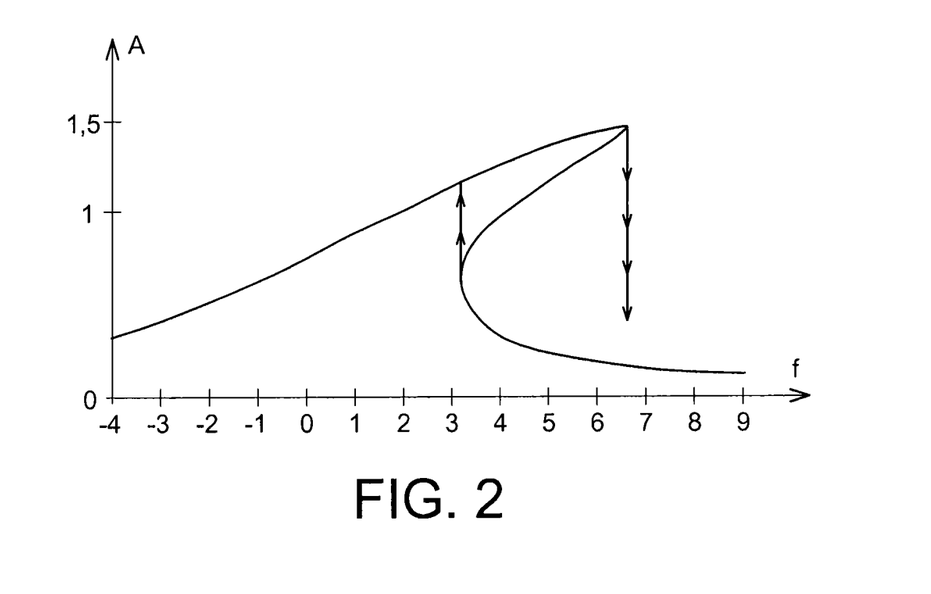
FIG. 2 illustrates schematically a hysteresis phenomenon which can affect such a device, and has previously been described.

In addition, the path followed is different from one direction to the other: a hysteresis is observed which is particularly visible in the diagram of FIG. 2: depending on the direction in which the frequency varies the way in which the amplitude changes differs.

The appearance of a non-linear regime is also related to a degradation of the noise. Indeed, noise (at low or high frequency) is mixed by the non-linear component of the resonator, and brings noise to the frequency of interest. On this subject, reference will be made to the following document:

[1] V. Kaajakari et al., 20 IEEE Trans. Ultrason. Ferroelectr. Freq. Control, 52, 2322-2331 (2005).

The amplitude is thus increased, and therefore the power of the carrier wave; but the noise is simultaneously degraded, which completely counteracts the advantage of increasing the amplitude.

Not only is the system consequently not stable in an open loop, but in addition the signal-to-noise ratio is degraded.

The source of this non-linearity is called "geometrical" and concerns all mechanical structures. For example, in the case of a beam P which is anchored at both ends E1 and E2 (see FIG. 3), the predominant non-linear effect is mid-plane stretching.

Figure 3:
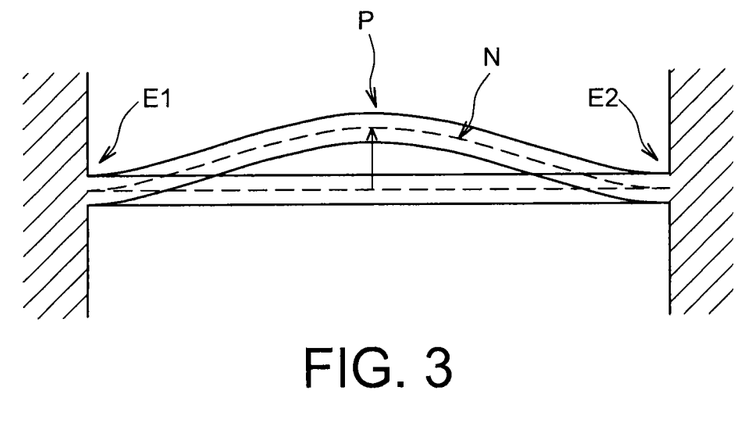
FIG. 3 illustrates schematically the extension of a beam which is anchored at its two ends, as this beam is subjected to bending at increasingly great amplitudes, and has previously been described.

In the field of large displacements, the length of the beam's neutral axis N can no longer be considered to be constant; the beam is extended as it is subjected to bending at increasingly large amplitudes.

Thus, the more the beam is subjected to bending at large amplitudes, the greater its stiffness becomes. This explains why the resonance peak "leans" towards the high frequencies.

In order to attenuate this source of non-linearity, and therefore in order not to restrict the amplitude of the vibrations to the same degree, another resonator, such as a beam having other boundary conditions, may be used.

For example, it is possible to use a beam having one free end, where the other end is anchored. With such a beam there is no mid-plane stretching effect; however, other sources of geometrical non-linearity are present, at greater amplitudes.

Other solutions have been proposed, for example the use of strain relief devices. On this subject, reference will be made to the following document:

[2] U.S. 2002/0011117, invention of E. Orsier et al., corresponding to FR2808264.

(2) Let us consider at present the reduction of the device's output noise.

The aim here is to increase the device's transduction gain, i.e. the ratio of the amplitude of the device's electrical output signal to the resonator's vibration amplitude.

At nanometric scales, the question of the choice of the transduction (notably among capacitive, piezoelectric and piezoresistive transductions) is unresolved. However, excellent gains have been obtained with piezoresistive transduction, whether the latter uses a metal material or a semiconductor material.

In relation to the latter material, reference may be made to the following document:

[3] E. Mile et al., Nanotechnology, Vol. 21 Issue 16, pp. 165504 (2010).

It is possible, for example, to use one piezoresistive transduction for each suspended strain gauge, combined with a mechanical amplification of the force using a leverage. On this subject, reference will be made to the following document:

[4] U.S. 2008/0314148, invention of P. Robert, corresponding to EP 2008965.

Figure 4:
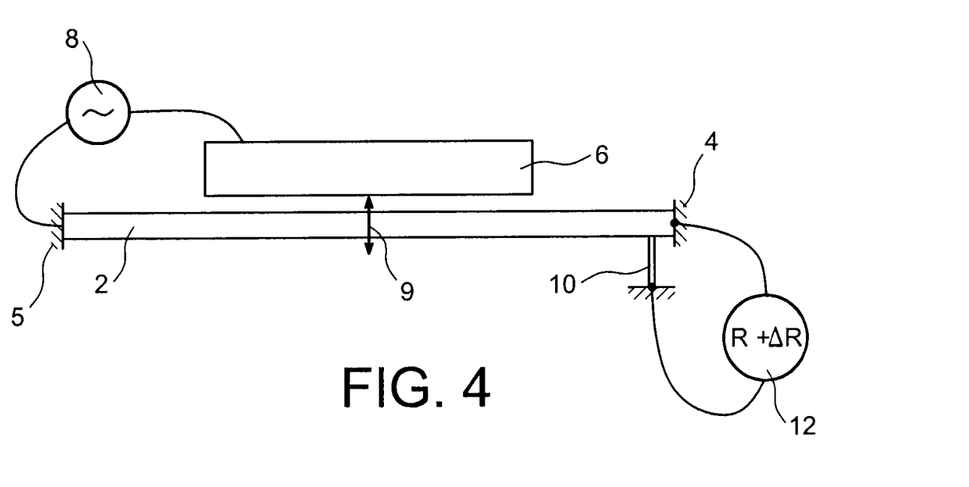
FIG. 4 is a schematic top view of a known resonant device, with piezoresistive detection, and has previously been described.

FIG. 4 is a schematic top view of an example of the resonant device, with piezoresistive detection, which is described in this document. It is formed on a substrate and includes:

a beam-shaped resonator 2 connected to the substrate by at least one anchoring 4 (in fact, in the represented example, there is a second anchoring 5, as can be seen), a fixed electrode 6 to operate the resonator, an alternative voltage source 8, to apply to the electrode an alternative voltage relative to the resonator, where the latter then vibrates in parallel to the plane of the surface of the substrate, which is represented symbolically by twin arrow 9 of FIG. 4, a suspended strain gauge 10, made of a piezoresistive material, and means 12 for measuring the strain to which gauge 10, or piezoresistive gauge, is subjected.

The latter is connected to resonator 2 at a point which is located outside anchoring 4. A leverage is thus present which enables the strain to which this gauge is subjected to be increased.

Such a solution is applicable to many devices in which the resonator is connected to the substrate by at least one anchoring in proximity to the strain gauge, particularly when the resonator is a free anchored beam.

Document [3] describes such a structure, together with actuation means, and a diagram of the assembly used to detect the resonator's movement.

In the device which is described in document [4], the beam forming the resonator includes, as has just been seen, at least one anchoring which connects it to the substrate. This poses a problem.

Indeed, a portion of the strain amplified by the leverage (resulting from the distance between the anchoring and the point at which the strain gauge is connected to the beam) is lost in the anchoring, whereas it is clearly desired to maximise the strain to which the piezoresistive gauge is subjected, or to which the piezoresistive gauges are subjected when the device includes more than one such gauge.

In addition, one of the sources of damping of the movement of the beam results from this loss of strain in the anchoring; the quality factor of the resonant device in question in document [4] is thereby degraded.

In addition, with certain applications, it may be necessary to use resonators with symmetrical boundary conditions, in particular resonators both ends of which are anchored, as opposed to resonators the boundary conditions of which are different at both ends, for example resonators one end of which is anchored while the other is free.

But the limit of the vibration amplitude, which is determined by the appearance of the non-linear behaviour (see above), may prevent the desired performance from being attained. This is the case, for example, with NEMS-based mass spectrometry.

DESCRIPTION OF THE INVENTION

The object of the present invention is a resonant device, including a resonator and means of detection of the resonator's displacement, where these detection means include at least one piezoresistive gauge.

In this device the resonator may have a high vibration amplitude, i.e. it may have a vibration regime which remains linear across a very wide field of amplitudes, whilst permitting use of symmetrical boundary conditions, i.e. conditions which are identical at both ends of the resonator, and whilst minimising loss of strain in an anchoring.

To accomplish this the resonator is anchored to the support, from which it is suspended, through at least one element which is flexurally elastic.

In addition, in a preferred embodiment of the device, spectral noise density $S_x$, and therefore the output noise, are low; in other words, the device's transduction gain is high.

To obtain this result, there is a leverage to amplify the force to which the piezoresistive gauge is subject.

More precisely, the object of the present invention is a resonant device with piezoresistive detection, where the device includes:

a support having a roughly flat surface, a resonator which is suspended from the support, and able to move parallel to the plane of the support's surface, means of actuating the resonator, and means for detecting the displacement of the resonator, including at least one piezoresistive strain gauge which is suspended from the support, characterised in that it also includes at least one elastic element through which the resonator is anchored to the support, where the element is flexurally elastic, to enable the threshold at which a non-linear regime of displacement of the resonator appears to be raised.

It is certainly the case that document WO 2010/015963 describes an electromechanical transducer including a beam forming a resonator which is suspended from a support through two strain gauges. But these gauges are only elastic along their respective axes.

In the device forming the object of the invention, conversely, in addition to one or more strain gauges, at least one flexurally elastic element is used, through which the resonator is anchored to the support. This element enables the threshold at which the non-linearities appear to be raised. Such a flexurally elastic element allows the resonator to have greater freedom of movement: for example, when the latter is beam-shaped, the element gives it a freedom of movement along its axis (longitudinal direction) and rotational freedom of movement (around an axis perpendicular to the plane of the figures of the present application).

A rectilinear element, with low flexural rigidity in the plane of the support, is suitable. All that is then required is for the element to have a large aspect ratio (ratio of its length to its width), for example greater than 10.

According to a particular embodiment of the invention, the piezoresistive strain gauge includes a stack including at least one piezoresistive material.

According to a preferred embodiment of the device forming the object of the invention, the strain gauge and the elastic element are roughly rectilinear, and are not extensions of one another.

The leverage mentioned above, which enables the force to which the piezoresistive gauge is subjected to be amplified, is thus obtained.

According to a particular embodiment of the device forming the subject of the invention, the resonator is beam-shaped, and the strain gauge and elastic element are located respectively on two opposite lateral faces of this beam.

According to another particular embodiment, the device includes two roughly rectilinear strain gauges, the resonator is beam-shaped, the two strain gauges are located respectively as extensions of one another, on two opposite lateral faces of the beam, and the elastic element is located on one of the lateral faces.

According to another particular embodiment, the resonator is beam-shaped, and the elastic element is located at one end of the beam, and forms with the latter an angle greater than or equal to zero, and less than 90°.

According to another particular embodiment, the device includes two roughly rectilinear strain gauges, the resonator has the shape of a tuning fork, with two roughly parallel beams and an elastic connection between the two beams, the elastic element is located at the elastic connection, and the two strain gauges are respectively located as extensions of one another, on both beams of the tuning fork.

According to another particular embodiment, the device includes two flexurally elastic elements, which are roughly rectilinear, the resonator is beam-shaped, both ends of the beam are capable of being displaced parallel to the plane of the support's surface, and the two elastic elements are respectively located at one of the ends of the beam, on two opposite lateral faces of it.

In this case the device can include two other flexurally elastic elements, which are roughly rectilinear and are located respectively at the other end of the beam, on the two opposite lateral faces of it.

According to another particular embodiment, the device includes at least two strain gauges, at least one of these strain gauges is flexurally elastic, and the element which is flexurally elastic is constituted by the flexurally elastic strain gauge.

The present invention also concerns a method for manufacturing the device forming the object of the invention, in which the resonator, each strain gauge and each elastic element are formed by a surface technology.

BRIEF DESCRIPTION OF THE DRAWINGS

The present invention will be better understood on reading the description of example embodiments given below, purely as an indication and in no sense restrictively, making reference to the appended illustrations in which.

DETAILED ACCOUNT OF PARTICULAR EMBODIMENTS

Figure 5:
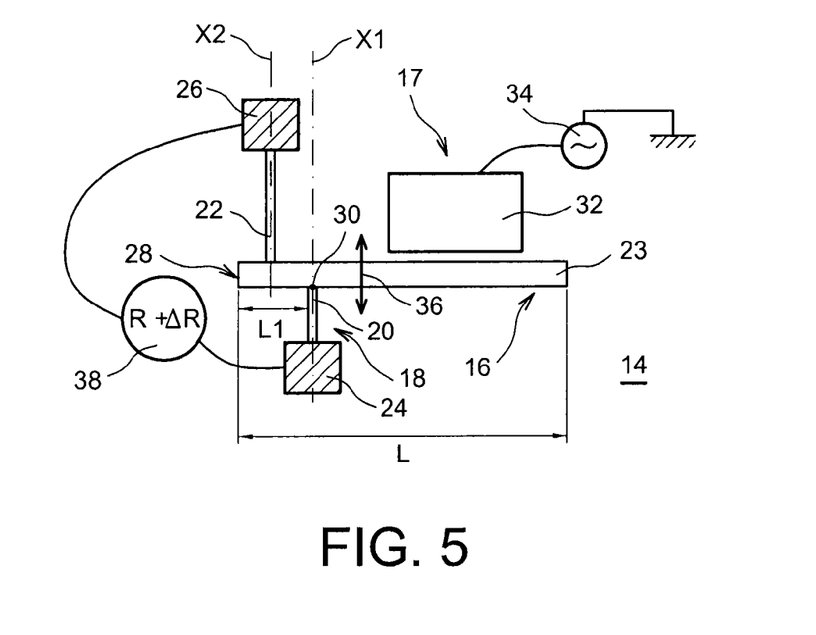
FIG. 5 is a schematic top view of a particular embodiment of the device which is one object of the invention.

FIG. 5 is a schematic top view of a particular embodiment of the resonant device which is one object of the invention.

The device represented in this figure includes:
a support 14, or substrate, the surface of which is roughly flat,
a resonator 16 which is suspended from support 14—it is also said that it is released from the support—and which is able to move parallel to the plane of the support's surface,
means 17 of actuating resonator 16, and
means 18 for detecting the displacement of resonator 16.

In the example represented in FIG. 5 these detection means 18 include a single piezoresistive strain gauge 20. This gauge is beam-shaped and it is therefore roughly rectilinear. In addition, it is suspended from support 14—it is released from it. This gauge may be made of a piezoresistive material, or may include a stack including at least one piezoresistive material.

In accordance with the invention, the resonator is not directly anchored to support 14: the device represented in FIG. 5 also includes an elastic element 22 through which the resonator is anchored to support 14. This enables the threshold at which a non-linear regime of displacement of the resonator appears to be raised.

In the example represented in FIG. 5, resonator 16 is beam-shaped. Elastic element 22 is also beam-shaped, and it is therefore roughly rectilinear, like strain gauge 20, or piezoresistive gauge.

But this gauge 20 and elastic element 22 are not extensions of one another: as can be seen, their respective axes X1 and X2 are set apart. In addition, gauge 20 and element 22 are respectively located on two opposite lateral faces of beam 23 forming the resonator.

The detection means include anchorings 24 and 26 through which gauge 20 and element 22 are respectively attached to support 14.

In the example represented in FIG. 5, gauge 20 and element 22 are both positioned perpendicular to beam 23 (and parallel to the surface of support 14); one end of element 22 is in proximity to one end 28 of beam 23, while its other end is attached to anchoring 26; and one end of gauge 20 is located at a point 30 of beam 23, set apart from end 28 of the latter, whereas the other end of gauge 20 is attached to anchoring 24.

In this example, actuation means 17 are of the electrostatic type, and include an electrode 32 which is attached to support 14. An alternative voltage source 34 is included to apply to electrode 32 an alternative voltage relative to beam 23. When the latter is thus excited, it vibrates parallel to the plane of the surface of support 14, which has been represented symbolically by twin arrow 36 in FIG. 5.

To excite the resonance of beam 23, other means than electrostatic means may be used, for example piezoelectric, thermal or electromagnetic means.

Element 22, or suspension beam, is released; in addition, it is preferable that its slenderness ratio, i.e. the ratio of its length to its width, should be large, for example greater than 5 but preferably greater than 10. Element 22 then offers only very little resistance to the movement of beam 23, and maximises the strain to which piezoresistive gauge 20 is subject.

Indeed, bearing in mind the slenderness ratio of element 22:
on one hand, the traction-compression stiffness of this element 22 on its axis X2 is very great; advantage is therefore taken of the leverage effect and of the amplification of the force exerted on the gauge (it is preferable that the (non-zero) distance between axis X1 of gauge 20 and axis X2 of suspension beam 22 should be small, for example less than one third of the length of beam 23,
but, on the other hand, the bending stiffness of element 22 is low; this element therefore "resists" very little the transverse bending movement of beam 23.

The dimensions of the piezoresistive gauge must be chosen to achieve the best possible compromise between the Johnson noise engendered by this gauge—this noise is proportional to the resistance of the gauge—and the strain to which the latter is subject, a strain which is inversely proportional to the gauge's transverse section.

At the first order a gauge is therefore chosen which is very short, and the transverse section of which is as small as possible.

The relative position of the gauge is also chosen in order to maximise the strains to which the gauge is subject. This position therefore depends on the chosen proper operating mode.

For example, in the case of FIG. 5, in respect of the resonance mode called "mode 1", it can be estimated that the optimum position is such that distance L1 between end 28 of beam 23 and point 30 is of the order of 10% of length L of beam 23.

The difference of design between the device which is one object of the invention, for example the device represented in FIG. 5, and the device which is described in document [4], does not change the manner in which the device is read in any way: in the present invention, here too, it is the change of resistance of one or more piezoresistive gauges which is read.

In the present invention, although the mechanical structure has been modified, this reading is nonetheless possible by connecting reading means 38 between respective anchorings 24 and 26 of gauge 20 and of element 22.

These anchorings 24 and 26 are then made of an electrically conductive material. It is moreover the same in all examples given subsequently, for the two anchorings between which the reading means are connected.

And naturally, in all the examples, the resonator and each elastic element used for reading (element 22 in the case of FIG. 5) are also made of a material able to conduct an electric current, for example of a piezoresistive material.

The variation of resistance of gauge 20 is therefore read conventionally, between the two anchorings used as electrical connections. This reading may be done:
  directly,
  or using a lock-in amplifier,
  or using a Wheatstone bridge (see document [4]),
  or by a more sophisticated technique, as is explained in document [3], to which reference will be made.

Conversely, the variation of resistance, read by this method, includes the variation of resistance of suspension beam 22, if the latter is also made of a piezoresistive material.

It is therefore necessary to ensure that the variation of resistance of suspension beam 22 is negligible in comparison to the "useful" variation of resistance of gauge 20. To accomplish this, it is for example possible:
  to give suspension beam 22 a transverse section greater than that given to gauge 20,
  or to dope suspension beam 22 locally in order to reduce its resistance and its gauge factor,
  or again to design these respective resistance variations such that they are of the same sign, placing gauge 20 and suspension beam 22 either side of beam 23 constituting the resonator, which is the case in the example represented in FIG. 5.

It is also possible to use two roughly rectilinear piezoresistive gauges, the respective axes of which coincide, and which are offset relative to the suspension beam. This allows a differential reading if the gauges are positioned either side of the resonator.

Figure 6:
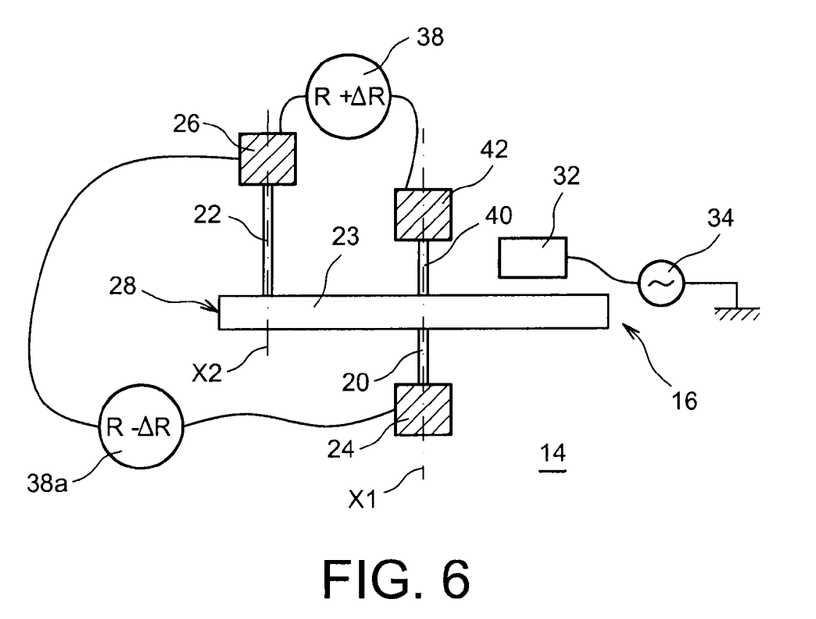
FIGS. 6 to 9 are schematic top views of other particular embodiments of this device.

The example of FIG. 6 schematically illustrates this possibility. The device represented in this figure is distinguished from that of FIG. 5 by the fact that it includes a roughly rectilinear piezoresistive gauge 40, the anchoring of which has reference 42. As can be seen, gauges 20 and 40 are located on two opposite lateral faces of beam 23, and have the same axis X1.

In the case of FIG. 6, a differential reading is used: the reading means include a first reading means 38 which is connected between anchorings 26 and 42 and enables value R+ΔR of the resistance of gauge 40 to be determined, and a second reading means 38*a* which is connected between anchorings 26 and 24 and enables value R−ΔR of the resistance of gauge 20 to be determined.

Two suspension beams may also be used. The overall stiffness is then increased but the device's access resistance is reduced if the two suspension beams are connected electrically: they then constitute two resistances installed in parallel.

Figure 7:
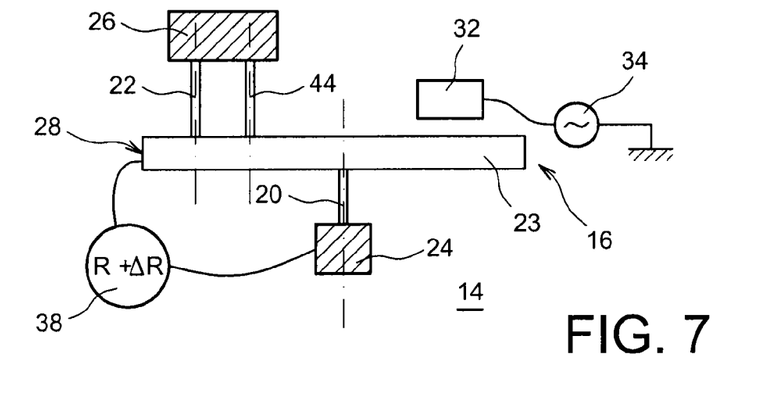

This is schematically illustrated by FIG. 7. The device represented in this figure is distinguished from that represented in FIG. 5 by the fact that it includes another suspension beam 44. As can be seen, both suspension beams 22 and 44, constituting two flexurally elastic elements, are on the same side of beam 16, and have a common anchoring 26 (see also another example in FIG. 11 which will be described below).

Figure 11:
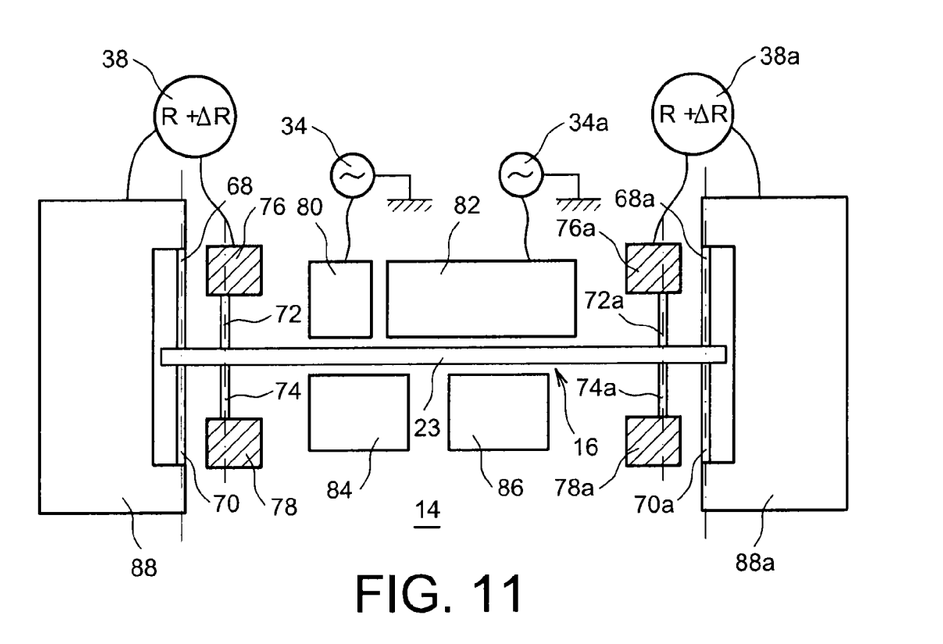
FIGS. 11 to 13 are schematic top views of other examples of the invention, in which the resonator has the shape of a beam both ends of which are free.

The two suspension beams may or may not be located at one of the two ends of the beam forming the resonator, and it is even possible to have two other suspension beams, connected in parallel, at the other end of the resonator (see also FIG. 11).

As for the piezoresistive gauges, unlike the case of FIG. 6, they can be positioned between end 28 of resonator 16 and suspension beam 22 (see FIG. 12 which will be described below).

It is also possible to position the (released) elastic element, which is beam-shaped, (a) in the axis of the beam-shaped resonator or (b) along a different axis.

In the latter case (b), displacement along the resonator's axis is not greatly favoured; the vibration amplitude is therefore does not increase greatly before the appearance of the non-linear regime; conversely, the strain passed on to anchoring 26 associated with elastic element 22 is minimised, and the strain to which gauge 20 is subjected is maximised.

Figure 8:
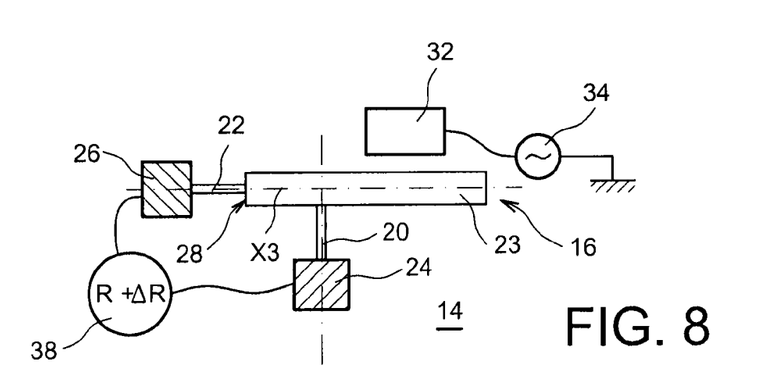
Figure 9:
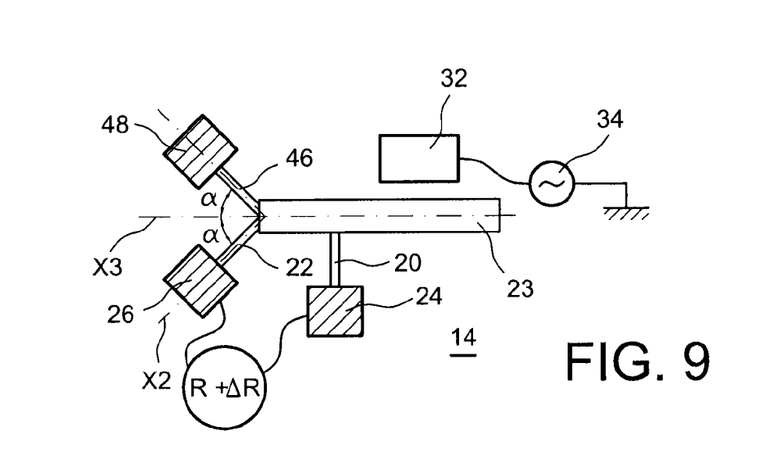

Both cases (a) and (b) are illustrated schematically by FIGS. 8 and 9.

The example of FIG. 8 is distinguished from that of FIG. 5 by the fact that, in the case of FIG. 8, beam-shaped elastic element 22 is attached to end 28 of beam 23, and extends along axis X3 of the latter.

In the example of FIG. 9, beam-shaped elastic element 22 is also attached to end 28 of beam 23, but axis X2 of this element makes an angle α with axis X3 of beam 23, such that: $0 < \alpha < 90°$ (while α is zero in the case of FIG. 8).

FIG. 9 also illustrates the possibility of having another flexurally elastic element 46, which has the shape of a beam, at end 28 of beam 23. The anchoring associated with it has reference 48 and axis X4 of element 46 is inclined relative to axis X3. In the example of FIG. 9, elements 22 and 46 are symmetrical with respect to one another, relative to axis X3.

As in some of the examples mentioned above, elements 22 and 46 can have the same anchoring, and then constitute resistances in parallel.

Figure 10:
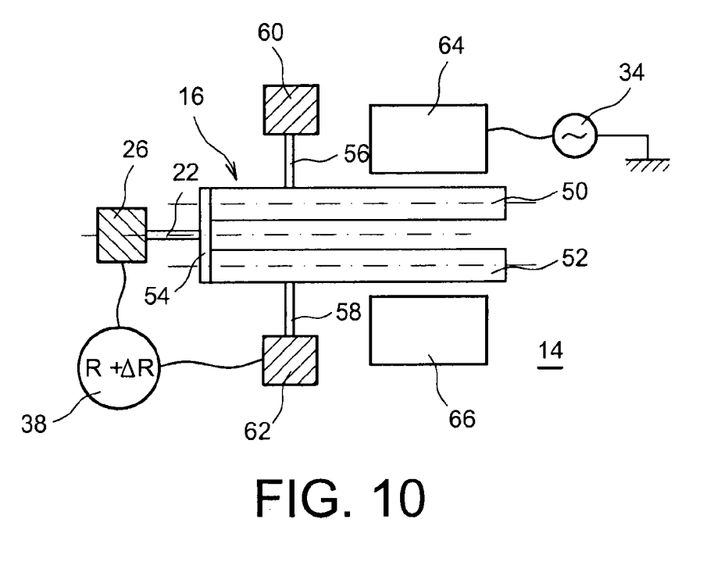
FIG. 10 is a schematic top view of the invention, in which the resonator has the shape of a tuning fork.

In another example of the invention, illustrated schematically by FIG. 10, resonator 16 has the shape of a tuning fork. It includes two parallel beams 50 and 52 and an elastic link 54 between two respective ends of the beams, as can be seen.

Elastic element 22, which is beam-shaped, is located in the area of elastic link 54; it preferably extends parallel to the (parallel) axes of beams 50 and 52.

Two roughly rectilinear piezoresistive gauges 56 and 58 are positioned as extensions of one another (their respective axes coincide), respectively on beams 50 and 52. The anchorings of gauges 56 and 58 have respective references 60 and 62.

Two electrodes 64 and 66, which are designed to actuate the tuning fork, are respectively positioned facing beams 50 and 52, as can be seen.

In the example represented in FIG. 10, reading means 38 are connected between anchorings 26 and 62, and source 34 excites electrode 64. However, it is also possible simultaneously to excite both electrodes 64 and 66 with source 34.

In the example of the invention which is illustrated schematically by FIG. 11, beam 23 used as a resonator has symmetrical boundary conditions: both its ends are able to move parallel to the surface of support 14.

Two roughly rectilinear flexurally elastic elements 68 and 70 are positioned respectively in proximity to one of the ends of beam 23, on two of its opposite lateral faces; and these elements 68 and 70 are extensions of one another: their respective axes coincide.

Two piezoresistive gauges 72 and 74 are located on both opposite lateral faces of beam 23, and their respective axes also coincide. The anchorings of beams 72 and 74 have respective references 76 and 78.

Several excitation electrodes may be included. In the represented example, there are four such, with respective references 80, 82, 84 and 86. Electrodes 80 and 82 are facing one of the lateral faces of beam 23, and electrodes 84 and 86 are opposite its other lateral face.

In the example of FIG. 11, merely electrode 80 is excited by means of source 34; and the reading means are connected between anchoring 76, associated with piezoresistive gauge 72, and an anchoring 88 which is common to elastic elements 68 and 70; these then form resistances installed in parallel.

As a variant, there can be an identical assembly of components, on the side of the other end of beam 23; the equivalent references are assigned the letter a.

In FIG. 10, flexurally elastic elements 68*a* and 70*a*, piezoresistive gauges 72*a* and 74*a*, anchorings 76*a* and 78*a*, a common anchoring 88*a*, a source 34*a* which excites electrode 82, and reading means 38*a* connected between anchoring 76*a* and anchoring 88*a* can thus be seen.

The configuration illustrated by FIG. 11, in which both ends of beam 23 are free, has various advantages, which are mentioned below.

1. This configuration always allows a reading of the gauges' resistance variations.

2. It uses symmetrical boundary conditions, but at the same time allows large linear vibration amplitudes.

Indeed, the suspension beams forming the elastic elements preferably have a high slenderness ratio; they then have a low bending stiffness, and the resonator is not therefore subject to strain on its axis. It is free to extend when the vibration amplitude increases.

Then, the mid-plane stretching effect is completely reduced, and the useful vibration amplitude becomes comparable to that of a cantilever-type resonator.

3. At each end of beam 23, both suspension beams have a common anchoring, and are therefore electrically connected. As was seen, they are thus equivalent to two resistances in parallel, the equivalent resistance of which is equal to half that of a single suspension beam.

In addition, when one of the two suspension beams is subject to compressive stress the other is subject to tensile stress. The sum of their resistance variations is consequently zero. The configuration of FIG. 11 therefore enables only the gauges' useful resistance variation to be read, and that of the suspension beams to be disregarded.

4. As was seen, the same arrangement may be used for the gauges and the suspension beams at the other end of the resonator (symmetrical boundary conditions). This enables another anchoring to be used, constituting a detection port, either to obtain a signal which has twice the value, or to make the structure resonate simultaneously with two modes.

5. As in all the other cases, one or more electrostatic actuation electrodes can be used. This enables certain privileged modes of the structure to be favoured, or two actuation harmonics at different frequencies to be decoupled.

Figure 12:
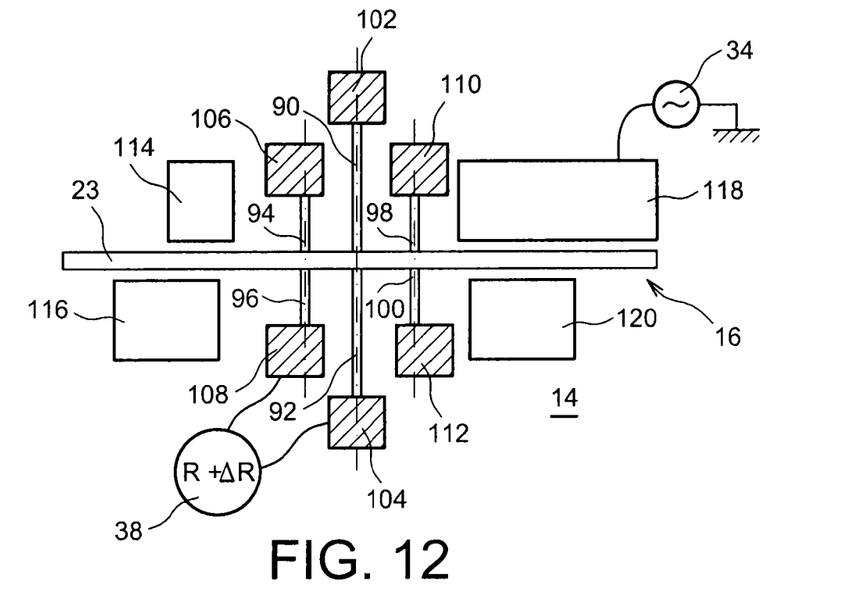

In the example which is illustrated schematically by FIG. 12 the piezoresistive gauges and the suspension beams are positioned in the middle of the resonator.

As can be seen, in this example beam 23, forming the resonator, has two roughly rectilinear elements 90 and 92 which are flexurally elastic and are positioned either side of beam 23, in the middle of the latter, and the respective axes of which coincide.

On one side of these elements two piezoresistive gauges 94 and 96 are positioned either side of beam 23, and their respective axes coincide. On the other side of elements 90 and 92, two other piezoresistive gauges 98 and 100 are also positioned either side of beam 23, and have coinciding respective axes.

The anchorings of elements 90 and 92 and of gauges 94, 96, 98 and 100 have, respectively, references 102, 104, 106, 108, 110 and 112.

In the example of FIG. 12 there are four actuation electrodes, namely two electrodes 114 and 116 at one end of beam 23, either side of the latter, and two other electrodes 118 and 120 at the other end of beam 23, either side of the latter.

In addition, as an example, electrode 118 is excited using source 34, and reading means 38 are connected between anchorings 96 and 104.

Other examples of the invention may be imagined, using one or more suspension beams, and one or more piezoresistive gauges.

A device in accordance with the invention which includes at least two piezoresistive gauges, and in which at least one of these gauges is elastic and constitutes the elastic element through which the resonator is anchored to the support, may also be imagined.

Figure 13:
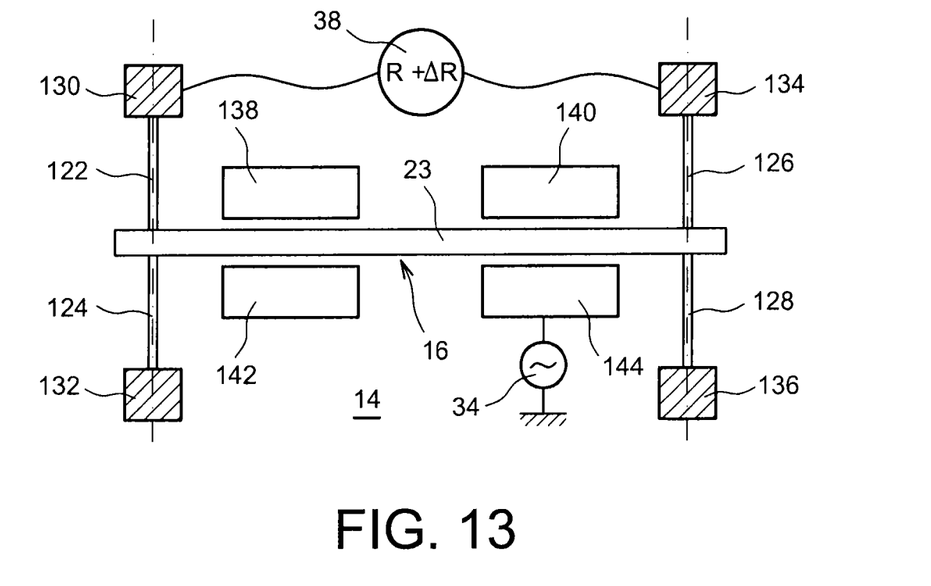

An example of such a device is illustrated schematically by FIG. 13.

In it, beam 23 forming the resonator, having four roughly rectilinear piezoresistive gauges 122, 124, 126 and 128, can be seen.

Gauges 122 and 124 are flexurally elastic, are positioned in proximity to one of the ends of beam 23, either side of the latter, and have coinciding axes. The other two gauges 126 and 128, which could also be flexurally elastic, are positioned in proximity to the other end of beam 23, either side of it, and also have coinciding axes.

The anchorings of gauges 122, 124, 126 and 128 have respective references 130, 132, 134 and 136.

In the example of FIG. 13 there are four actuation electrodes, namely two electrodes 138 and 140 positioned in proximity to the middle of beam 23, facing one of the latter's lateral faces, and two other electrodes 142 and 144 positioned facing the other lateral face, and respectively facing electrodes 138 and 140.

In addition, as an example, electrode 134 is excited using source 34, and reading means 38 are connected between anchorings 130 and 134.

The piezoresistive gauges used in the invention can be made of doped silicon. They can also be metal; to accomplish this the silicon can be doped very strongly until it becomes amorphised. Gauges made of a metal-silicon compound such as NiSi or PtSi, for example, can also be used.

The gauges can also be obtained from silicon elements to which a metal layer is applied, for example one made of gold or of aluminium, to constitute the sensitive portion of the gauges.

A device in accordance with the invention can be manufactured using a surface technology.

Figure 14A:
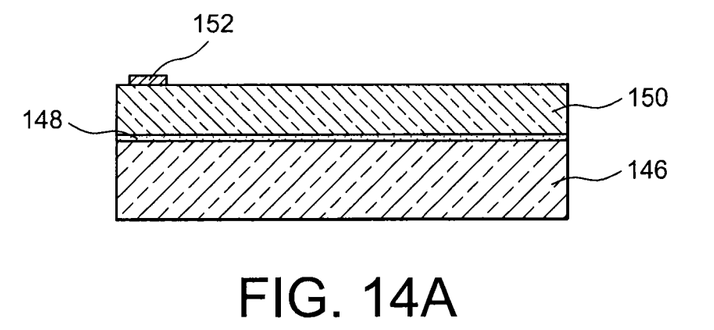
FIGS. 14A to 14C illustrate schematically different steps of a method of manufacture of a device in accordance with the invention.
Figure 14B:
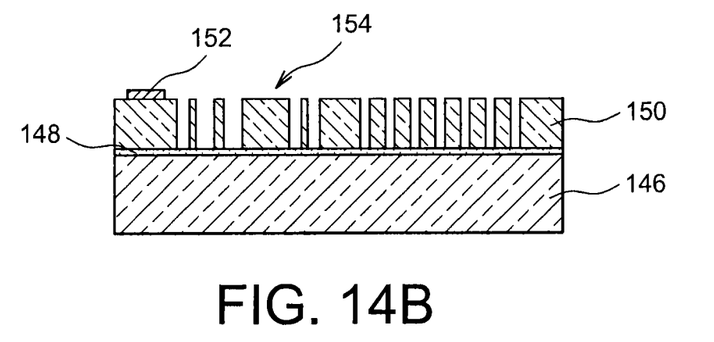
Figure 14C:
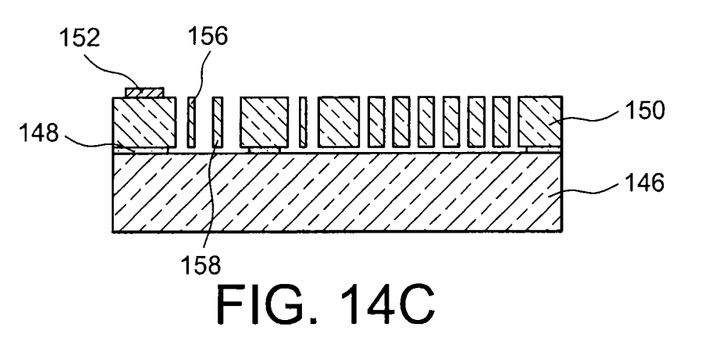

An example of a manufacturing method is illustrated schematically and partially by FIGS. 14A to 14C.

The first stage (FIG. 14A) consists in applying a layer of Ti/Ni/Au on an SOI substrate including a silicon base substrate 146, an $SiO_2$ sacrificial layer 148, the thickness of which is equal, for example, to 0.4 µm, and a silicon layer 150, the thickness of which is equal, for example, to 4 µm. The contacts of the device, such as contact 152, are delimited by photolithography and etching.

After this (FIG. 14B), mechanical structure 154 of the device is delimited by photolithography and DRIE (Deep Reaction Ion Etching), stopping at sacrificial layer 148.

After this (FIG. 14C), the components of the device are released by exposure to hydrofluoric acid (in liquid or gaseous form), stopping after a determined time.

By this means one or more piezoresistive gauges such as gauge 156, a resonator 158, one or more elastic elements (not represented), and one or more excitation electrodes (not represented) of the resonator are obtained.

In this method the photolithography may be accomplished by means of an electron beam.

The resonator itself, but above all the piezoresistive gauges and the elastic elements, can be nanowires which are formed by a surface technology of the "top-down" type, in accordance with another example manufacturing method, which is illustrated schematically by FIGS. 15A to 15D.

The first stage is to form a sacrificial layer 160 (FIG. 15A) which can be made of $SiO_2$, SiGe or Si. An active layer 162 is then formed on layer 160.

Figure 15A:
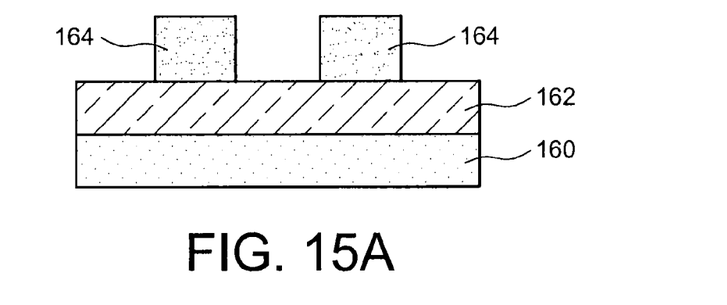
FIGS. 15A to 15D illustrate schematically different steps of another method of manufacture of a device in accordance with the invention.
Figure 15B:
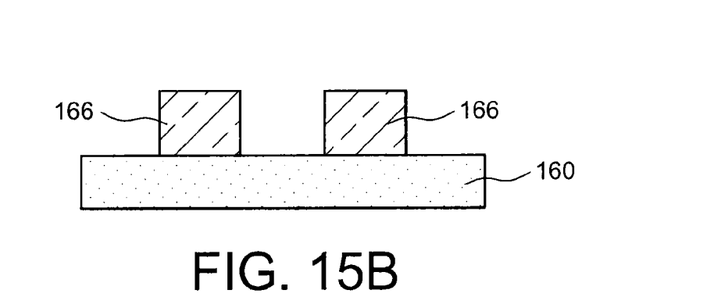

Layer 162 may be made of Si or SiGe. This is the layer in which the various elements, or patterns, of the device are formed, such as the resonator, which may for example be beam-shaped, one or more piezoresistive gauges, and one or more elastic elements.

A photosensitive resin mask 164, which is required to obtain the patterns, is then formed.

These patterns, such as patterns 166 (FIG. 15B), are then defined by photolithography and etching of the active layer. Resist trimming may be undertaken beforehand.

Figure 15C:
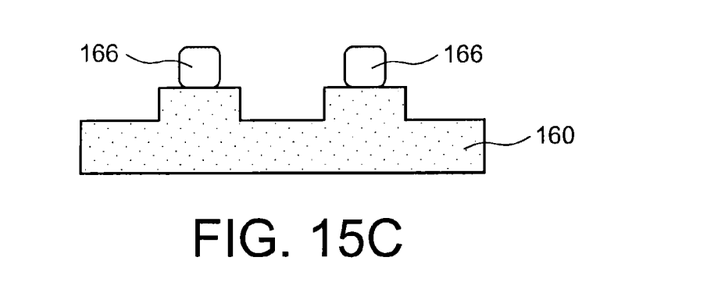
Figure 15D:
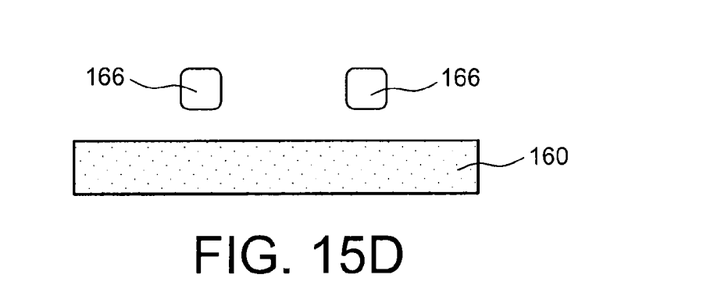

Oxidation followed by deoxidation are then accomplished to reduce the size of patterns 166 and to round them (FIG. 15C).

Patterns 166 (FIG. 15D) are then released, using hydrochloric acid in the case of $SiO_2$, or using a plasma of the methane-oxygen type in the case of SiGe.

The invention claimed is:

1. A resonant device with piezoresistive detection, comprising:
    a support having a roughly flat surface,
    a resonator suspended from the support, and able to move parallel to the plane of the surface of the support,
    means for actuating the resonator,
    means for detecting the displacement of the resonator, including at least one piezoresistive strain gauge suspended from the support,
    at least one elastic element which is separate from the at least one piezoresistive strain gauge through which the resonator is anchored to the support, wherein the at least one elastic element is flexurally elastic, to enable a threshold at which a non-linear regime of displacement of the resonator appears to be raised, wherein the resonator comprises a material able to conduct an electric current.

2. A device according to claim 1, in which the at least one elastic element is roughly rectilinear and wherein the ratio of its length to its width is greater than 5.

3. A device according to claim 2, wherein the ratio is greater than 10.

4. A device according to claim 1, in which the piezoresistive strain gauge includes a stack including at least one piezoresistive material.

5. A device according to claim 1, in which the strain gauge and the at least one elastic element are roughly rectilinear, and are not extensions of one another.

6. A device according to claim 5, in which the resonator is beam-shaped and in which the strain gauge and the at least one elastic element are located respectively on two opposite lateral faces of the beam.

7. A device according to claim 1, further comprising:
    two roughly rectilinear strain gauges,
    in which the at least one elastic element is roughly rectilinear, the strain gauges and the elastic element are not extensions of one another, the resonator is a beam which is beam-shaped, the two roughly rectilinear strain gauges are located respectively as extensions of one another, on two opposite lateral faces of the beam, and the at least one elastic element is located on one of the lateral faces.

8. A device according to claim 5, in which the resonator is a beam which is beam-shaped and the at least one elastic element is located at one end of the beam, and forms with the latter an angle greater than or equal to zero, and less than 90°.

9. A device according to claim 1, further comprising:
    two roughly rectilinear strain gauges,
    in which the at least one elastic element is roughly rectilinear, the two roughly rectilinear strain gauges and the elastic element are not extensions of one another, the resonator has the shape of a tuning fork, with two roughly parallel beams and an elastic connection between the two beams, the elastic element is located at the elastic connection, and the two roughly rectilinear strain gauges are respectively located as extensions of one another, on both beams of the tuning fork.

10. A device according to claim 1, further comprising:
    two flexurally elastic elements, which are roughly rectilinear,
    in which the strain gauge is roughly rectilinear, the elastic elements and the strain gauge are not extensions of one another, the resonator is a beam which is beam-shaped, both ends of the beam are capable of being displaced parallel to the plane of the surface of the support, and the two flexurally elastic elements are respectively located at one of the ends of the beam, on two opposite lateral faces of it.

11. A device according to claim 10, further comprising:
    two other flexurally elastic elements, which are roughly rectilinear and are located respectively at the other end of the beam, on the two opposite lateral faces of it.

12. A device according to claim 1, further comprising:
at least two roughly rectilinear strain gauges,
in which the at least two roughly rectilinear strain gauges and the elastic element are not extensions of one another, at least one of the at least two roughly rectilinear strain gauges is flexurally elastic, and the flexurally elastic element is constituted by the strain gauge which is flexurally elastic.

* * * * *